US012052846B2

(12) United States Patent
Chen et al.

(10) Patent No.: US 12,052,846 B2
(45) Date of Patent: Jul. 30, 2024

(54) COMBINATION HEAT SINK

(71) Applicant: Quanta Computer Inc., Taoyuan (TW)

(72) Inventors: Yi-Chieh Chen, Taoyuan (TW);
Yueh-Chang Wu, Taoyuan (TW);
Ching-Yi Shih, Taoyuan (TW); Kang Hsu, Taoyuan (TW)

(73) Assignee: QUANTA COMPUTER INC., Taoyuan (TW)

( * ) Notice: Subject to any disclaimer, the term of this patent is extended or adjusted under 35 U.S.C. 154(b) by 139 days.

(21) Appl. No.: 17/670,113

(22) Filed: Feb. 11, 2022

(65) Prior Publication Data

US 2023/0262937 A1   Aug. 17, 2023

(51) Int. Cl.
*H05K 7/20* (2006.01)
*F28D 21/00* (2006.01)
(Continued)

(52) U.S. Cl.
CPC ......... *H05K 7/20409* (2013.01); *F28D 21/00* (2013.01); *F28F 3/02* (2013.01);
(Continued)

(58) Field of Classification Search
CPC .... F28F 2215/04; F28F 21/084; F28F 21/082; H05K 7/20409; H05K 7/20418;
(Continued)

(56) References Cited

U.S. PATENT DOCUMENTS 5,709,263 A * 1/1998 Mira ................... H01L 23/3672
257/722
6,000,132 A * 12/1999 Butler ................. H01L 23/3672
29/521
(Continued)

FOREIGN PATENT DOCUMENTS

CN   106839852 A   6/2017
CN   213692028 U   7/2021
(Continued)

OTHER PUBLICATIONS

TW Office Action for Application No. 111123024, mailed Apr. 10, 2023, w/ First Office Action Summary.
(Continued)

*Primary Examiner* — Jianying C Atkisson
*Assistant Examiner* — For K Ling
(74) *Attorney, Agent, or Firm* — NIXON PEABODY LLP (57) ABSTRACT

A heat sink comprises a first portion and a second portion. The first portion is configured to contact a heat-generating electronic component. The first portion is formed from a first group of materials and has a first plurality of fins. The second portion is coupled to the first portion. The second portion is formed from a second group of materials and has a second plurality of fins. The second group of materials is different than the first group of materials. The first group of materials can include extruded aluminum, stamped aluminum, or both. The second group of materials can include die-cast metal. The first plurality of fins can have a smaller fin pitch than the second plurality of fins. The heat sink can further comprise a third portion coupled to the first portion, such that the first portion is positioned between the second portion and the third portion.

17 Claims, 6 Drawing Sheets

(51) Int. Cl.
*F28F 3/02* (2006.01)
*F28F 21/08* (2006.01)

(52) U.S. Cl.
CPC ....... *F28F 21/084* (2013.01); *H05K 7/20518* (2013.01); *H05K 7/20727* (2013.01); *B23P 2700/10* (2013.01); *F28D 2021/0029* (2013.01)

(58) Field of Classification Search
CPC ............ H05K 7/20509; H05K 7/20518; B23P 2700/10; H01L 23/3677; H01L 23/3672; H01L 23/367
See application file for complete search history.

(56) References Cited

U.S. PATENT DOCUMENTS

| | | | | |
|---|---|---|---|---|
| 6,296,048 | B1* | 10/2001 | Sauer | H01L 23/3672 257/722 |
| 6,625,025 | B1* | 9/2003 | Duxbury | H05K 7/20518 174/548 |
| 6,698,500 | B2* | 3/2004 | Noda | H01L 23/3672 174/16.3 |
| 7,224,582 | B1* | 5/2007 | Saturley | H05K 9/0049 361/679.54 |
| 9,756,761 | B2* | 9/2017 | Inoue | H05K 7/20154 |
| 9,781,820 | B2* | 10/2017 | Matsumoto | H01L 23/3675 |
| 10,219,365 | B1* | 2/2019 | Chen | H01L 23/3672 |
| 10,477,728 | B2* | 11/2019 | Yatskov | H05K 7/2039 |
| 2005/0013119 | A1* | 1/2005 | Misra | H01L 23/367 257/E23.102 |
| 2005/0041391 | A1* | 2/2005 | Wrycraft | G06F 1/20 361/695 |
| 2006/0126309 | A1* | 6/2006 | Bolle | H05K 7/20436 361/719 |
| 2007/0107871 | A1* | 5/2007 | Xia | F28F 3/02 257/E23.099 |
| 2008/0239679 | A1* | 10/2008 | Deng | H01L 23/3736 361/720 |
| 2009/0199997 | A1* | 8/2009 | Koplow | F28F 13/125 165/80.3 |
| 2009/0223647 | A1* | 9/2009 | Alousi | F28D 15/0233 165/80.3 |
| 2011/0214904 | A1* | 9/2011 | Ohsawa | H01L 23/3736 165/185 |
| 2011/0226451 | A1* | 9/2011 | Ikeda | H05K 7/20163 165/121 |
| 2014/0014308 | A1* | 1/2014 | Wu | H05K 7/20409 165/185 |
| 2014/0318167 | A1* | 10/2014 | Uchida | G06F 1/20 62/519 |
| 2016/0118315 | A1* | 4/2016 | Smith | H01L 23/427 257/713 |
| 2016/0265853 | A1 | 9/2016 | Chen et al. | |
| 2016/0284624 | A1* | 9/2016 | Yamada | H01L 23/4338 |
| 2019/0373761 | A1* | 12/2019 | Silvennoinen | H05K 7/209 |

FOREIGN PATENT DOCUMENTS

TW         521957 U     2/2003
TW    201007438 A     2/2010

OTHER PUBLICATIONS

TW Search Report for Application No. 111123024, mailed Apr. 10, 2023, w/ First Office Action.

* cited by examiner

COMBINATION HEAT SINK

FIELD OF THE INVENTION

The present invention relates generally to a heat sink, and more specifically, to a combination heat sink that includes at least two different portions that have different heat dissipation properties.

BACKGROUND OF THE INVENTION

Computing devices, such as edge servers, include electronic components that generate a large amount of heat. Heat sinks are used to keep these heat-generating electronic components cool during operation, as well as other components within the computing devices. These heat sinks often include fins that aid in removing heat from the various components. However, heat sinks can suffer from a number of different flaws that reduce their heat removal capacity. In one example, certain materials remove heat less efficiently. In another example, certain materials lead to poor arrangements of fins, which leads to a reduction in the heat removal. Thus, new heat sinks for use in computing devices are needed to improve the removal of heat generated by electronic components.

SUMMARY OF THE INVENTION

The term embodiment and like terms, e.g., implementation, configuration, aspect, example, and option, are intended to refer broadly to all of the subject matter of this disclosure and the claims below. Statements containing these terms should be understood not to limit the subject matter described herein or to limit the meaning or scope of the claims below. Embodiments of the present disclosure covered herein are defined by the claims below, not this summary. This summary is a high-level overview of various aspects of the disclosure and introduces some of the concepts that are further described in the Detailed Description section below. This summary is not intended to identify key or essential features of the claimed subject matter. This summary is also not intended to be used in isolation to determine the scope of the claimed subject matter. The subject matter should be understood by reference to appropriate portions of the entire specification of this disclosure, any or all drawings, and each claim.

According to certain aspects of the present disclosure, a heat sink for cooling a computing device comprises a first portion and a second portion. The first portion is configured to contact a heat-generating electronic component of the computing device. The first portion is formed from a first group one or more materials and has a first plurality of fins. The second portion is coupled to the first portion. The second portion is formed from a second group of one or more materials and has a second plurality of fins. The second group of one or more materials is different than the first group of one or more materials.

In some implementations, the first group of one or more materials includes extruded aluminum, stamped aluminum, or both. In some implementations, the extruded aluminum, the stamped aluminum, or both, has a thermal conductivity of between about 200 W/m*K and about 250 W/m*k.

In some implementations, the second group of materials includes a die-cast metal. In some implementations, the die-cast metal is die-cast aluminum or a die-cast aluminum alloy. In some implementations, the die-cast metal has a thermal conductivity of between about 50 W/m*K and about 100 W/m*K.

In some implementations, the first plurality of fins has a first fin pitch, and the second plurality of fins has a second fin pitch that is larger than the first fin pitch. In some implementations, a distance between adjacent fins of the first plurality of fins is less than a distance between adjacent fins of the second plurality of fins.

In some implementations, a combined surface area of the first plurality of fins is larger than the combined surface area of the second plurality of fins.

In some implementations, the first portion includes a base, and the first plurality of fins is coupled to the base. In some implementations, at least a portion of the first plurality of fins is formed as a stack of fins that is coupled to the base of the first portion. The fins of the portion of the first plurality of fins are formed individually, and then stacked together to form the stack of fins. In some implementations, the base of the first portion is formed from extruded aluminum, and each fin of the portion of the first plurality of fins is formed from stamped aluminum.

In some implementations, the first plurality of fins includes a first subset of fins and a second subset of fins. The first subset of fins has a fin pitch that is larger than a fin pitch of the second subset of fins. In some implementations, each fin of the first subset of fins is formed from a die-casting process, and each fin of the second subset of fins is formed from stamped aluminum.

In some implementations, the heat sink further comprises a third portion coupled to the first portion such that the first portion is positioned between the second portion and the third portion. In some implementations, the third portion includes a third plurality of fins that is generally identical to the second plurality of fins, and the third portion is formed from the same second group of one or more materials as the second portion.

According to certain aspects of the present disclosure, a computing device comprises a motherboard, a heat-generating electronic component, and a heat sink. The heat-generating electronic component is disposed on the motherboard. The heat sink contacts the heat-generating electronic component. The heat sink includes a first portion and a second portion. The first portion is in direct contact with the heat-generating electronic component, while the second component does not contact the heat-generating electronic component. The first portion is formed from a first group of one or more materials and has a first plurality of fins. The second portion is formed from a second group of one or more materials and has a second plurality of fins. The second group of one or more materials is different than the first group of one or more materials.

In some implementations, the heat sink further includes a third portion that does not contact the heat-generating electronic component. The third portion is coupled to the first portion such that the first portion is positioned between the second portion and the third portion.

In some implementations, the first plurality of fins includes a first subset of fins and a second subset of fins. The first subset of fins has a fin pitch that is larger than the second subset of fins. In some implementations, the first subset of fins is formed from die-cast metal, and the second subset of fins is formed from stamped aluminum, such that the first group of one or more materials includes die-cast metal and stamped aluminum. In some implementations, air is configured to flow past the heat sink in a first direction. The first subset of fins and the second subset of fins are aligned in the first direction, such that the air flowing past the heat sink reaches the first subset of fins before the second subset of fins.

In some implementations, the computing device further comprises abase. The heat sink is coupled to the base such that the motherboard and the heat-generating electronic component are positioned between the base and the heat sink, and such that the heat sink forms a top cover of the computing device.

The above summary is not intended to represent each embodiment or every aspect of the present disclosure. Rather, the foregoing summary merely provides an example of some of the novel aspects and features set forth herein. The above features and advantages, and other features and advantages of the present disclosure, will be readily apparent from the following detailed description of representative embodiments and modes for carrying out the present invention, when taken in connection with the accompanying drawings and the appended claims. Additional aspects of the disclosure will be apparent to those of ordinary skill in the art in view of the detailed description of various embodiments, which is made with reference to the drawings, a brief description of which is provided below.

BRIEF DESCRIPTION OF THE DRAWINGS

The disclosure, and its advantages and drawings, will be better understood from the following description of representative embodiments together with reference to the accompanying drawings. These drawings depict only representative embodiments, and are therefore not to be considered as limitations on the scope of the various embodiments or claims.

DETAILED DESCRIPTION

Computing devices (such as rack servers, edge servers, etc.) typically contain one or more heat-generating electronic components, such as a central processing unit (CPU), a graphics processing unit (GPU), and others. To aid in cooling these heat-generating electronic components, heat sinks can be used. A heat sink is a device that physically contacts the heat-generating electronic component. The heat sink is generally made from one or more thermally conductive materials, such that heat generated by the heat-generating electronic components is easily transferred to the heat sink. The heat sink will often include one or more fins, which are generally thin portions of the heat sink that extend outward from the main body of the heat sink. The fins are generally separated by open spaces, which allows air to flow through the fins. The air flowing past the fins removes heat from the fins, which in turn allows the fins to continue absorbing heat from the heat-generating electronic component. Heat sinks can be made from different materials and have different arrangements of fins, which results in different amounts of heat removal capacity. Disclosed herein is a combination heat sink that includes different portions that are made from different materials, and/or different portions that have different arrangements of fins.

Various embodiments are described with reference to the attached figures, where like reference numerals are used throughout the figures to designate similar or equivalent elements. The figures are not necessarily drawn to scale and are provided merely to illustrate aspects and features of the present disclosure. Numerous specific details, relationships, and methods are set forth to provide a full understanding of certain aspects and features of the present disclosure, although one having ordinary skill in the relevant art will recognize that these aspects and features can be practiced without one or more of the specific details, with other relationships, or with other methods. In some instances, well-known structures or operations are not shown in detail for illustrative purposes. The various embodiments disclosed herein are not necessarily limited by the illustrated ordering of acts or events, as some acts may occur in different orders and/or concurrently with other acts or events. Furthermore, not all illustrated acts or events are necessarily required to implement certain aspects and features of the present disclosure.

For purposes of the present detailed description, unless specifically disclaimed, and where appropriate, the singular includes the plural and vice versa. The word "including" means "including without limitation." Moreover, words of approximation, such as "about," "almost," "substantially," "approximately," and the like, can be used herein to mean "at," "near," "nearly at," "within 3-5% of," "within acceptable manufacturing tolerances of," or any logical combination thereof. Similarly, terms "vertical" or "horizontal" are intended to additionally include "within 3-5% of" a vertical or horizontal orientation, respectively. Additionally, words of direction, such as "top," "bottom," "left," "right," "above," and "below" are intended to relate to the equivalent direction as depicted in a reference illustration; as understood contextually from the object(s) or element(s) being referenced, such as from a commonly used position for the object(s) or element(s); or as otherwise described herein.

Figure 1A:
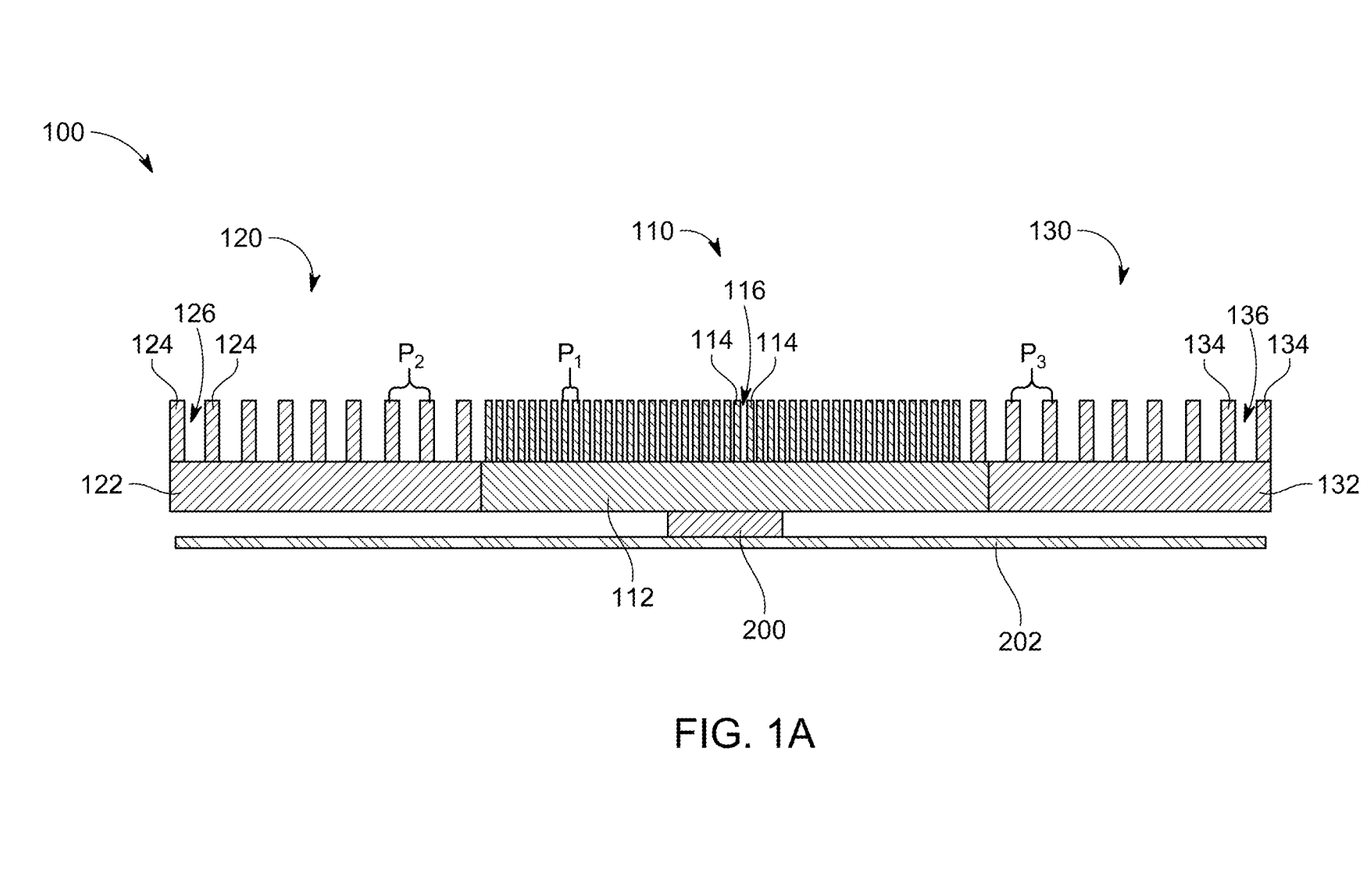
FIG. 1A is a rear view of a heat sink for removing heat from a heat-generating electronic component, according to certain aspects of the present disclosure.

FIG. 1A illustrates a rear view of a heat sink 100 according to various aspects of the present disclosure. As shown, the heat sink 100 contacts a heat-generating electronic component 200, which in turn is disposed on a motherboard 202. The heat sink 100, the heat-generating electronic component 200, and the motherboard 202 all form part of a computing device, such as a server (e.g., an edge server). In some implementations, the heat sink 100 forms the top cover of the computing device. In these implementations, the computing device will generally include a base on which the motherboard 202 sits. The base can be coupled to the heat sink 100. The base and/or the heat sink 100 will include sidewalls, such that when the base is coupled to the heat sink 100, the heat-generating electronic component 200 and the motherboard 202 are positioned within an internal cavity defined by the base, the sidewalls, and the heat sink 100. In other implementations, the heat sink 100 is an internal component of the computing device. The computing device will generally include a chassis, and the heat sink 100, the heat-generating electronic component 200, and the motherboard 202 will all be positioned within the chassis.

The heat sink 100 includes multiple different portions with different heat removal capacities. In the illustrated implementation, the heat sink 100 includes a first portion 110, a second portion 120, and a third portion 130. The first portion 110 is a central portion, and contacts the heat-generating electronic component 200. In some implementations, the first portion 110 is in direct contact with the heat-generating electronic component 200. As used herein, "direct contact" can refer to implementations where the first portion 110 is placed directly on the heat-generating electronic component 200 with no other materials or objects between the first portion 110 and the heat-generating electronic component 200. However, "direct contact" can also refer to implementations where an amount of thermal interface material is positioned between the first portion 110 and the heat-generating electronic component. The thermal interface material can include thermal paste, thermal adhesive, thermal gap filler, one or more thermally conductive pads (e.g., pads made of silicone or silicone-like material), thermal tape, phase-change material, a metallic thermal interface material, any thermally conductive and electrically insulating material, any material configured to improve the thermal coupling between the first portion 110 and the heat-generating electronic component 200, other materials, or any combination thereof.

The second portion 120 and the third portion 130 are both outer portions, and are positioned on either side of the first portion 110. Thus, the first portion 110 is positioned between the second portion 120 and the third portion 130. The second portion 120 and the third portion 130 do not contact the heat-generating electronic component 200. Instead, the second portion 120 and the third portion 130 extend outward relative to the heat-generating electronic component 200, over the motherboard 202.

Each of the portions of the heat sink 100 includes a base and a plurality of fins extending from the base. The first portion 110 includes a base 112 and a plurality of fins 114 extending from the base 112. The second portion 120 includes a base 122 and a plurality of fins 124 extending from the base 122. The third portion 130 includes a base 132 and a plurality of fins 134 extending from the base 132. The bases 112, 122, and 132 are each generally formed as a solid piece of material with no gaps or channels through which air can flow. Each of the fins in the pluralities of fins 114, 124, and 134 is generally formed as a thin piece of material that extends from the respective base 112, 122, and 132 in a direction opposite of the heat-generating electronic component 200 and the motherboard 202.

As shown in the rear view of FIG. 1A, each fin of the pluralities of fins 114, 124, and 134 is separated from an adjacent fin by an air channel that extends at least a portion of the length of the heat sink 100 (e.g., the dimension of the heat sink 100 along an axis that extends into and out of the plane of FIG. 1A). Air can flow through the air channels, which aids in removing heat from the heat sink 100. In the first portion 110, adjacent fins of the plurality of fins 114 are separated by a gap 116. In the second portion 120, adjacent fins of the plurality of fins 124 are separated by a gap 126. In the third portion 130, adjacent fins the plurality of fins 134 are separated by a gap 136. In FIG. 1A, only two of the fins of each portion 110, 120, and 130 are identified with reference numerals 114, 124, and 134, respectively. However, as used herein, the plurality of fins of any of the portions 110, 120, 130 of the heat sink generally refers to all of the fins of that portion 110, 120, 130.

In the illustrated implementation, the plurality of fins 114 of the first portion 110 has a different arrangement than the plurality of fins 124 of the second portion 120, and the plurality of fins 134 of the third portion 130. The pitch of the fins describes the distance between adjacent fins. A smaller pitch (sometimes referred to as a "fin pitch") means that each fin is closer to an adjacent fin, as compared to a plurality of fins having a larger pitch. In the illustrated implementation, the plurality of fins 114 of the first portion 110 has a pitch $P_1$ that is less than (i) a pitch $P_2$ of the plurality of fins 124 of the second portion 120, and (ii) a pitch $P_3$ of the plurality of fins 134 of the third portion 130. Thus, the width of the gap 116 between each adjacent pair of the plurality of fins 114 is smaller than (i) the width of the gap 126 between each adjacent pair of the plurality of fins 124, and (ii) the width of the gap 126 between each adjacent pair of the plurality of fins 134.

In some implementations, the spacing between the pluralities of fins 114, 124, and 134 is generally constant. In these implementations, the pitch of each of the pluralities of fins 114, 124, and 134 is generally a constant value. In other implementations, the spacing between the pluralities of fins 114, 124, and 134 is varied. This variation in spacing could be intentional, but could additionally or alternative by an artifact of the manufacturing process used to produce the fins. In these implementations, the pitches of the pluralities of fins 114, 124, and 134 may vary, but fall within a predetermined range. In some implementations, the pitch $P_1$ is between about 1 mm (millimeter) and about 3 mm, or is about 1.5 mm. In some implementations, the pitch $P_2$ is between about 3 mm and about 5 mm. In some implementations, the pitch $P_3$ is between about 3 mm and about 5 mm. In some implementations, the pitch $P_2$ is the same as (or about the same as) the pitch $P_3$. In some implementations, the pitch $P_2$ is different than the pitch $P_3$.

In some implementations, the combined surface area of the plurality of fins 114 (e.g., the sum of the surface area of each fin of the plurality of fins 114) will be larger than the combined surface area of the plurality of fins 124, and the combined surface area of the plurality of fins 134. In other implementations, some or all of the fins of the plurality of fins 114 have a shorter length than the fins of the plurality of fins 124 and/or the plurality of fins 134. Depending on their arrangements, the total surface area of the plurality of fins 114 can thus be larger than, smaller than, or equal to the total surface area of the plurality of fins 124, and to the total surface area of the plurality of fins 134.

The pluralities of fins 114, 124, and 134 can also have a variety of different arrangements. For example, in the illustrated implementation, the first portion 110 of the heat sink 100 includes more fins than the second portion 120 or the third portion 130. In other implementations, each of the portions 110, 120, and 130 could include an equal number of fins, or could each include a different number of fins. In some implementations, each fin of the pluralities of fins 114, 124, and 134 has the same length (e.g., the distance along the axis that extends into and out of the plane of FIG. 1A). In other implementations, there may be differences in the lengths of the pluralities of fins 114, 124, and 134. Further, in some implementations, the pluralities of fins 114, 124, and 134 are designed so that each has a desired combined surface area.

As is discussed in further detail herein, the different portions 110, 120, and 130 can be formed using different manufacturing processes. These different manufacturing processes may have different limitations associated with the arrangements of the fins. For example, one manufacturing process may have a minimum fin pitch that is larger than the minimum fin pitch of a different manufacturing process. By adjusting the number and/or length of the fins, a desired combined surface area for each of the pluralities of fins 114, 124, and 134 can be achieved. In some of these implementations, each of the pluralities of fins 114, 124, and 134 has the same combined surface area. In others of these implementations, the pluralities of fins 124 and 134 each have the same combined surface area, while the plurality of fins 114 has a different combined surface area.

The different portions of the heat sink 100 can be formed using different manufacturing processes, and can be formed from different materials. The first portion 110, the second portion 120, and the third portion 130 can be formed from a group of one or more materials, which can include extruded material (such as extruded aluminum or other extruded metals and non-metals), stamped material (such as stamped aluminum or other stamped metals and non-metals), die-cast material (such as die-cast aluminum or other die-cast metals and non-metals), other materials, or any combination of these materials. In the illustrated implementations, the base 112 of the first portion 110 is formed using an extrusion process. The base 112 may thus be formed from a variety of different extruded materials, including extruded aluminum. In some implementations, the base 112 is formed from extruded aluminum and has a thermal conductivity of about 237 W/m*K (Watts per meter-Kelvin), or between about 200 W/m*K and about 250 W/m*K. After the base 112 is formed, the base 112 and the first plurality of fins 114 can be soldered together.

In some implementations, the plurality of fins 114 is formed from stacked fins, which are sometimes referred to as zipper fins, bonded fins, or folded fins. Stacked fins are fins that are generally formed individually, then stacked into an array of fins and fastened together. The fins may be fastened together by utilizing high pressure to press the individual fins together. The stack of fins forming the plurality of fins 114 can then be coupled to the base 112, to form the first portion 110 of the heat sink 100. Stacked fins allow for a smaller fin pitch and more regular arrangement than other manufacturing processes, and can increase the total surface area of the fins that air can flow past. The plurality of fins 114 can be made of any suitable metal, such as aluminum, copper, and other metals.

The individual fins in the plurality of fins 114 can themselves be formed using any suitable manufacturing process. In some implementations, the individual fins of the plurality of fins 114 are each formed via a metal stamping process, and are then stacked together. In these implementations, the metal can be aluminum, such that the first plurality of fins 114 is formed from stamped aluminum. In some implementations, the individual fins are formed via extrusion, and then stacked together. In these implementations, the extruded material can be aluminum, such that the first plurality of fins 114 is formed from extruded aluminum.

Regardless of how the individual fins of the plurality of fins 114 are formed (e.g., stamping and/or extrusion), extrusion is generally not used to form the plurality of fins 114 together as a single array. Forming heat sink fins via extrusion as a single array frequently results in a higher than desired fin pitch (e.g., the fins are further apart than is desirable), and an irregular arrangement of fins. Thus, the fins of the plurality of fins 114 are formed individually (for example via stamping or extrusion), and then stacked together. Other manufacturing processes can also be used to form the individual fins of the plurality of fins 114. In some implementations, the fins of the plurality of fins 114 have a thermal conductivity of about 237 W/m*K, or between about 200 W/m*K and about 250 W/m*K. In any implementation, after the plurality of fins 114 is formed (e.g., after the individual fins are formed and then stacked together), the plurality of fins 114 is coupled to the base 112, for example via a soldering process. Because the base 112 and the plurality of fins 114 are form In the illustrated implementation, the second portion 120 and the third portion 130 are both formed using a die-casting process. Generally, the base 122 and the plurality of fins 124 will be die-cast together as a single integral piece of material. Similarly, the base 132 and the plurality of fins 134 will also be die-cast together as a single integral piece of material. The second portion 120 and the third portion 130 can then each be coupled to opposite sides of the first portion 110. The second portion 120 and the third portion 130 can be die-cast using any suitable metal, such as aluminum or an aluminum alloy. Other metals can also be used, such as zinc, copper, magnesium, lead, pewter, tin, alloys of these metals, and/or other metals. The material forming the second portion 120 and the third portion 130 can have a thermal conductivity of about 96 W/m*K, or between about 50 W/m*K and about 100 W/m*K.

Using different materials and fin arrangements for the separate portions 110, 120, and 130 of the heat sink 100 allows the heat sink 100 to effectively remove heat that is generated by the heat-generating electronic component 200, while at the same time reducing the manufacturing cost of the heat sink 100 to an acceptable level. Generally, extruded aluminum (and other materials used in the extrusion process) has a higher thermal conductivity than die-cast metal and other materials. Extruded aluminum (and/or other extruded metals) can thus be used to form the base 112 and the plurality of fins 114 of the first portion 110, which is the portion of the heat sink 100 that physically contacts the heat-generating electronic component 200. However, the plurality of fins 114 is generally not formed together as a single array using an extrusion process. Extruding the plurality of fins 114 together as a single array often results in an irregular arrangement and larger fin pitch, which decreases the heat removal performance. Instead, each fine of the plurality of fins 114 is formed individually, and the individual fins are then stacked together. Each individual fin of the plurality of fins 114 can still be formed via the extrusion process (for example, using extruded aluminum). The plurality of fins thus retains the higher thermal conductivity of extruded aluminum, while having the smaller fin pitch and more regular arrangement of stacked fins.

The second portion 120 and the third portion 130 do not have stacked fins however, because using stacked fins can increase the manufacturing cost of the heat sink 100 above a desired level. Instead, the pluralities of fins 124 and 134 are each formed together as a single array of fins. Because of the deficiencies in forming arrays of fins via an extrusion process, the second portion 120 and the third portion 130 are instead each formed as a single integral piece using die-casting. The base 122 and the plurality of fins 124 are formed together as a single integral piece to form the second portion 120. The base 132 and the plurality of fins 134 are formed together as a single integral piece to form the third portion 130.

While the die-cast metal of the second portion 120 and the third portion 130 has a lower thermal conductivity than extruded aluminum, this lower thermal conductivity is generally acceptable for two reasons. First, arrays of fins that die-cast together will generally be of a higher quality (e.g., smaller fin pitch, more regular arrangement) than arrays of fins formed via extrusion, and thus will offer better heat removal performance. Second, the second portion 120 and the third portion 130 do not contact the heat-generating electronic component 200, and thus the thermal conductivity of the material is less important than the manufacturing quality of the fins (e.g., obtaining pluralities of fins with a desired pitch and arrangement).

Figure 1B:
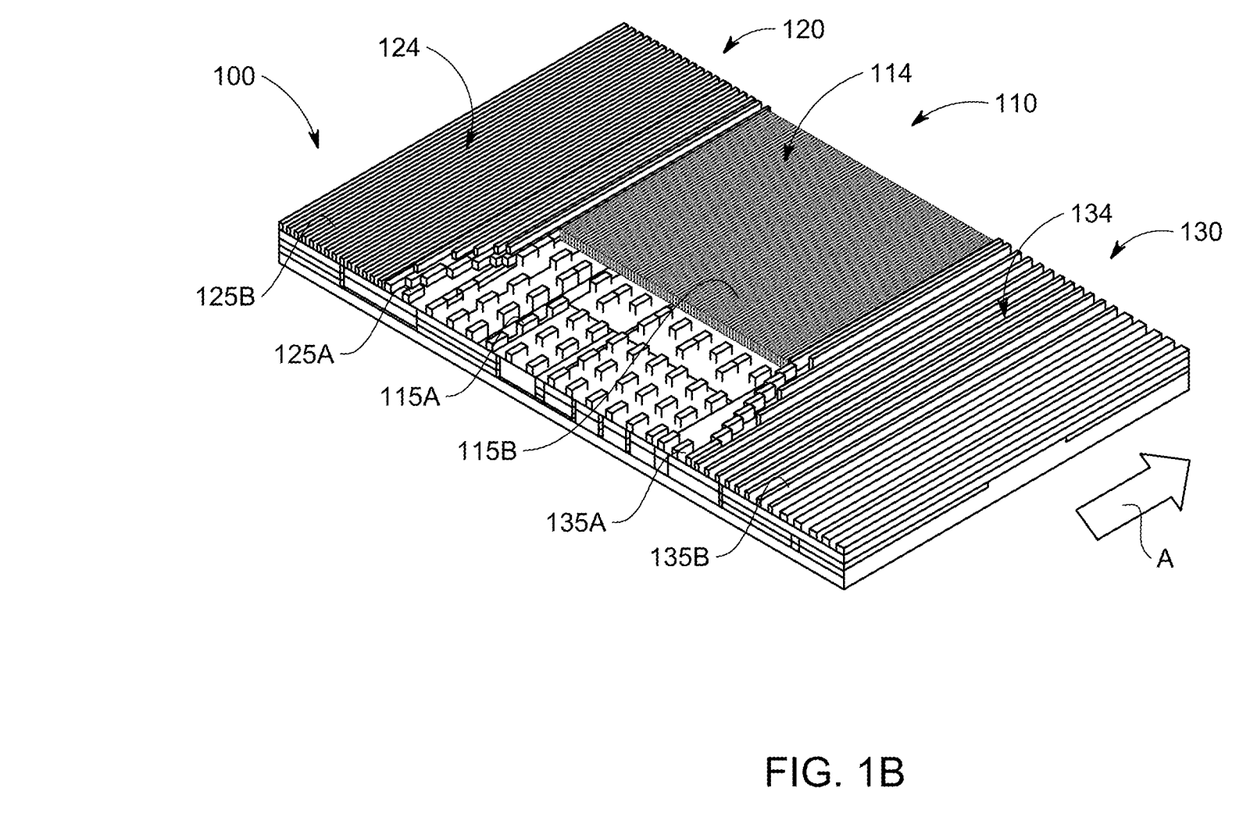
FIG. 1B is an isometric view of the heat sink of FIG. 1A, according to certain aspects of the present disclosure.

FIG. 1B shows an isometric view of the heat sink 100. The first portion 110 is generally located in the center of the heat sink 100, while the second portion 120 and the third portion 130 are positioned on either side of the first portion 110. The pluralities of fins 114, 124, and 134 are visible in FIG. 1B, and the direction of airflow past the fins is denoted with arrow A. As can be seen, the first plurality of fins 114 is separated into a first subset of fins 115A and a second subset of fins 115B. The first subset of fins 115A and the second subset of fins 115B are aligned in the direction of the airflow. The first subset of fins 115A is located closer to the origin of the airflow than the second subset of fins 115B, and thus air flowing past the heat sink 100 reaches the first subset of fins 115A before the second subset of fins 115B.

In some implementations, the first subset of fins 115A is formed from a different manufacturing process as compared to the second subset of fins 115B. For example, the second subset of fins 115B will generally be stacked fins as discussed above with respect to FIG. 1B. Thus, each fin of the second subset of fins 115B will generally be formed individually (for example, via a stamping process or an extrusion process), stacked together, and coupled to the base 112 (for example, via soldering). The first subset of fins 115A does not include stacked fins however. Instead, the first subset of fins 115A can be formed using a die-casting process (similar to the plurality of fins 124 and the plurality of fins 134). After being formed, the first subset of fins 115A can be coupled to the base 112 (for example, via soldering). In other implementations however, the first subset of fins 115A and the second subset of fins 115B are formed using the same manufacturing process. Thus, in some implementations, the first portion 110 is formed from a first group of materials that includes extruded aluminum (the base 112), die-cast metal (the first subset of fins 115A), and stamped aluminum (the second subset of fins 115B, which are stacked together and coupled to the base 112).

In any of these implementations, the heat-generating electronic component 200 (not shown in FIG. 1B) is generally located underneath the area of the first portion 110 where the second subset of fins 115B is located. The first subset of fins 115A is more sparse than the second subset of fins 115B, and thus has a larger fin pitch (e.g., distance between adjacent fins) than the second subset of fins 115B.

The plurality of fins 124 of the second portion 120 has two different subsets of fins, similar to the plurality of fins 114 of the first portion 110. The plurality of fins 124 includes a first subset of fins 125A and a second subset of fins 125B. The first subset of fins 125A is more sparse than the second subset of fins 125B, and is located in the corner of the second portion 120 that is nearest to (i) the first portion 110, and (ii) the origin of the airflow. Generally, the first subset of fins 125A and the second subset of fins 125B are both formed using a die-casting process (either with the base 122, or separately from the base 122). The first subset of fins 125A of the second portion 120 is thus generally continuous with the first subset of fins 115A of the first portion 110. Thus, in some implementations, the second portion 120 is formed from a second group of material that includes only die-cast metal.

The plurality of fins 134 of the third portion 130 also has two subsets of fins 135A and 135B. The first subset of fins 135A is more sparse than the second subset of fins 135B, and is located in the corner of the third portion 130 that is nearest to (i) the first portion 110, and (ii) the origin of the airflow. Generally, the first subset of fins 135A and the second subset of fins 135B are both formed using a die-casting process (either with the base 132, or separately from the base 132). The first subset of fins 135A of the third portion 130 is thus also generally continuous with the first subset of fins 115A of the first portion 110. Thus, in some implementations, the third portion 130 is formed from a third group of material that includes only die-cast metal. In these implementations, the third group of materials forming the third portion 130 is the same as the second group of materials forming the second portion 120.

Together, the first subset of fins 115A, the first subset of fins 125A, and the first subset of fins 135A form a generally trapezoidal arrangement of more sparse fins that is located between the original of the airflow and the heat-generating electronic component 200. These more sparse fins allow more of the air to initially flow into the air channels defined by the first subsets of fins 115A, 125A, and 135A, and then into the air channels defined by the second subsets of fins 115B, 125B, and 135B, which allows more heat to be removed from the heat-generating electronic component.

Figure 2A:
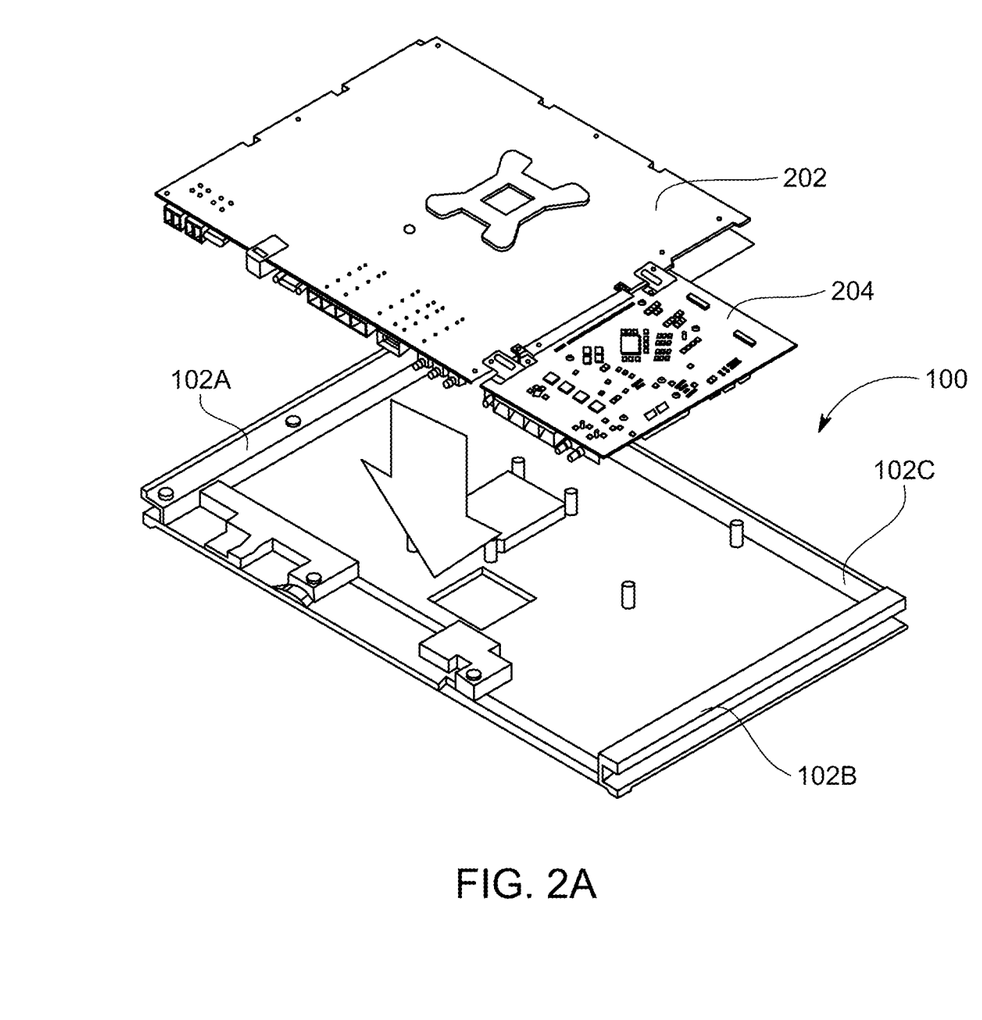
FIG. 2A is a first step of a process for assembling a computing device that uses the heat sink of FIG. 1A as a top cover, according to certain aspects of the present disclosure.

FIG. 2A is a perspective view of a first step in the process for assembling a computing device, where the heat sink 100 forms the top cover of the computing device. In the first step, the motherboard 202 is coupled to the heat sink 100. The heat sink 100 includes sidewalls 102A, 102B, and 102C that will form sidewalls of the computing device once fully assembled. In the illustrated implementation, the heat sink 100 is positioned upside down, and the motherboard 202 is placed on top of the underside of the heat sink. Generally, the motherboard 202 will be fully assembled prior to the first step. Thus, the heat-generating electronic component (not visible in FIG. 2A), and any other required components (such as one or more expansion cards) are positioned on and/or coupled to the motherboard 202 when the motherboard 202 is coupled to the heat sink 100.

Figure 2B:
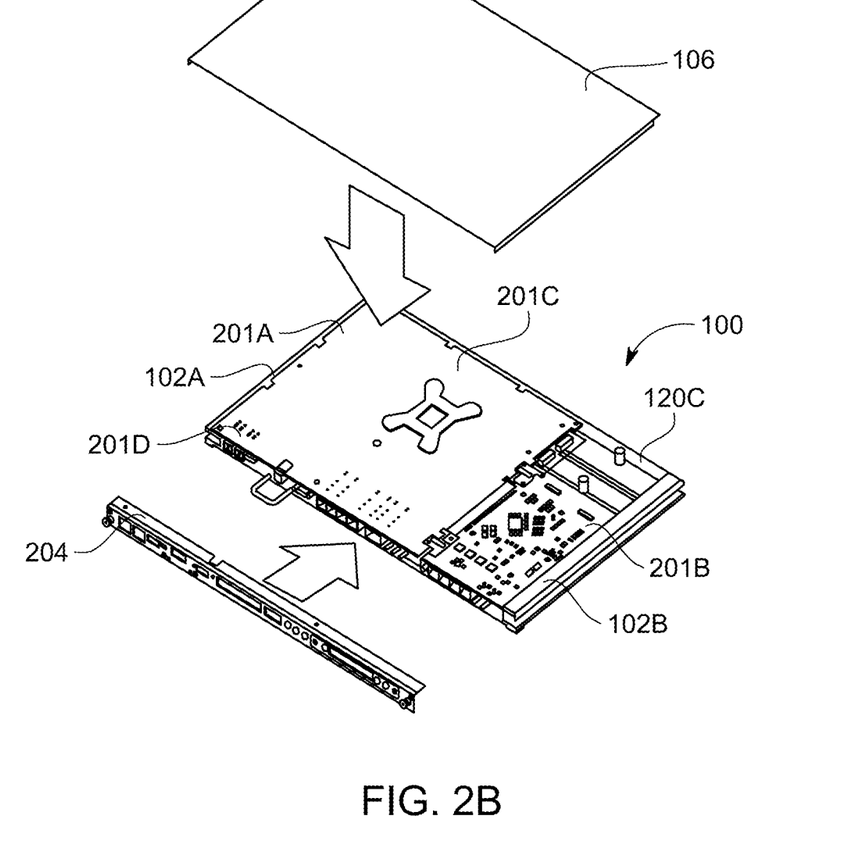
FIG. 2B is a second step of the process for assembling a computing device that uses the heat sink of FIG. 1A as a top cover, according to certain aspects of the present disclosure.

FIG. 2B is a perspective view of a second step in the process for assembling the computing device. Here, an input/output (I/O) cover 204 is coupled to the heat sink 100. As is shown in FIG. 2B, once the motherboard 202 is coupled to the heat sink 100, the sidewalls 102A, 102B, and 102C of the heat sink 100 surround three edges 201A, 201B, and 201C of the motherboard 202. The I/O cover 204 is positioned adjacent to a fourth edge 201D of the motherboard 202. The I/O cover 204 has a length that generally spans the distance between the sidewall 102A and the sidewall 102B (e.g., the distance between the edges 201A and 201B of the motherboard 202). The I/O cover 204 includes a variety of openings defined therein through which various ports and connectors on the motherboard 202 will extend when the I/O cover 204 is coupled to the heat sink 100. The second step further includes coupling a base 106 to the heat sink 100. The base 106 is a flat piece of material (such as metal or plastic) that has generally the same area as the heat sink 100. Thus, the base 106 spans the entire underside of the heat sink 100, between the sidewalls 102A and 102B, and between the sidewall 102C and the I/O cover 204.

Figure 2C:
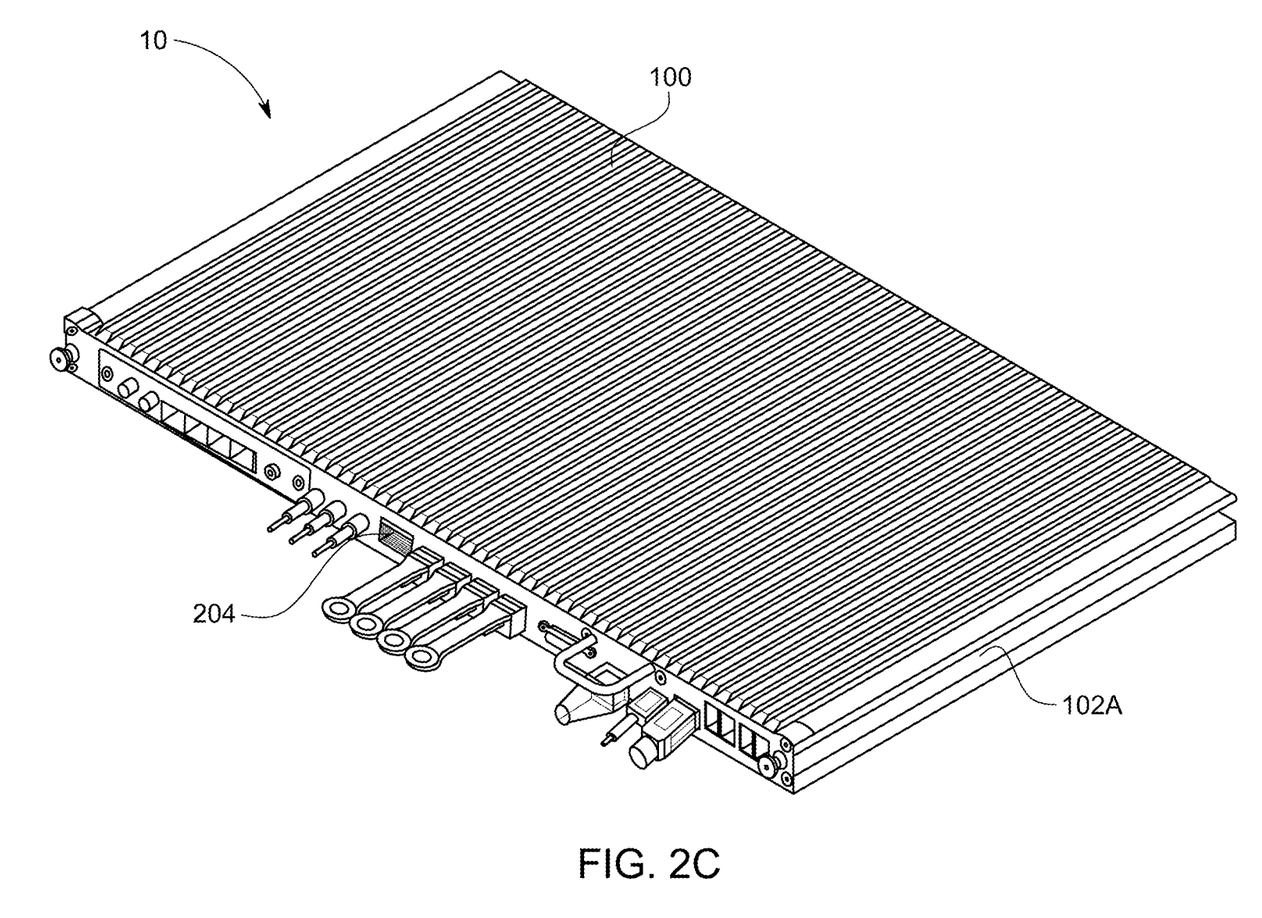
FIG. 2C is the computing device assembled according to the steps shown in FIG. 2A and FIG. 2B, according to certain aspects of the present disclosure.

FIG. 2C shows a computing device 10 that has been assembled according to the steps illustrated in FIGS. 2A and 2B. As shown, the heat sink 100 forms the top cover of the computing device 10. The sidewall 102A of the heat sink 100 forms one sidewall of the computing device 10. The sidewalls 102B and 102C (not visible in FIG. 2C) form two other sidewalls of the computing device 10. The I/O cover 204 forms a fourth sidewall of the computing device 10.

Figure 3:
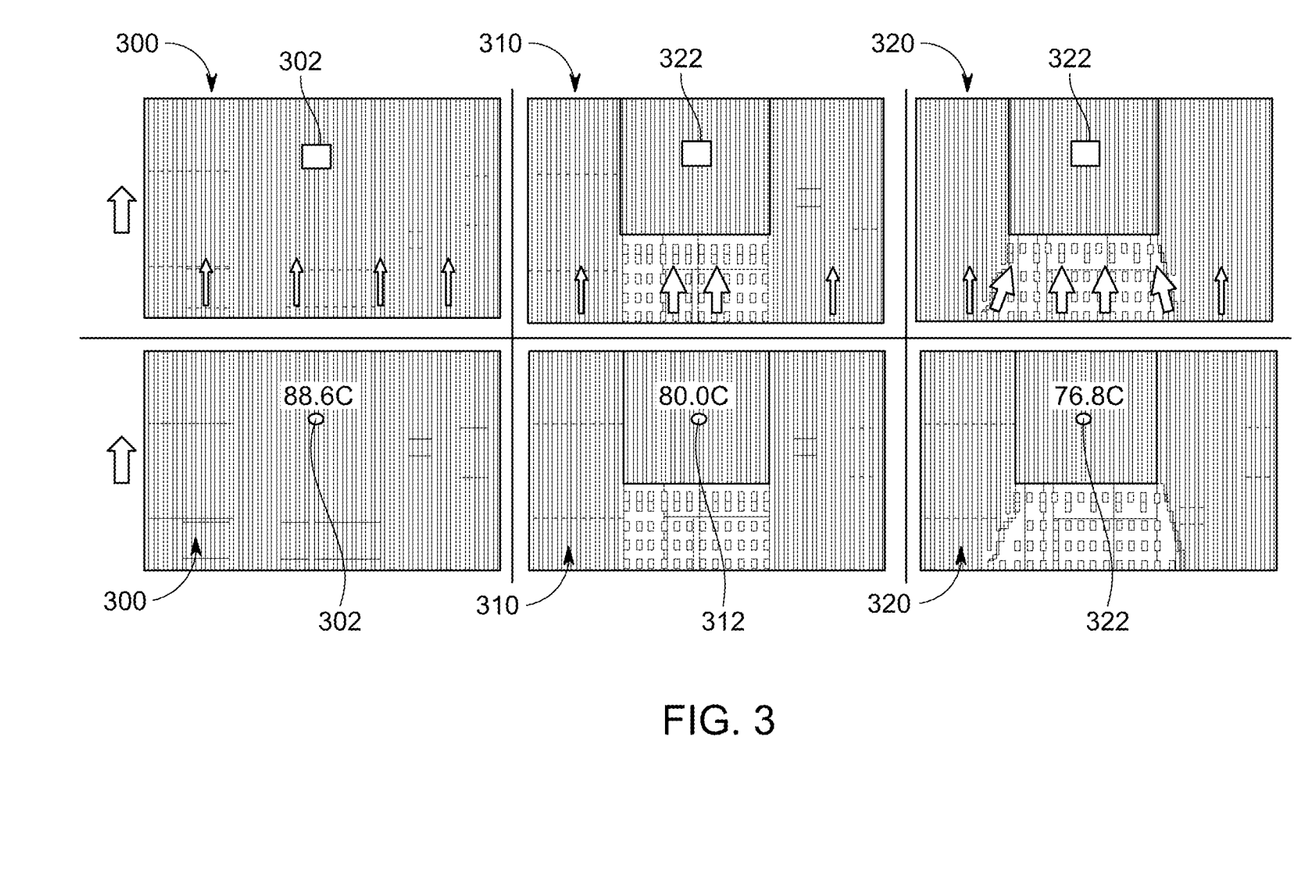
FIG. 3 is a comparison of the designs and heat removal performance of the heat sink of FIG. 1A and two other example heat sinks, according to certain aspects of the present disclosure.

FIG. 3 shows a performance comparison between the heat sink disclosed herein, and two other example heat sinks. To analyze the heat sinks, a heat-generating electronic component having dimensions of approximately 34 millimeters by 34 millimeters, and generating 101 watts of heat was used, along with an airflow of 80 cubic feet per minute (CFM). The top row of FIG. 3 shows the design of the heat sinks, and the bottom row of FIG. 3 shows a thermal image of the heat sink during operation of the heat-generating electronic component. The direction of the airflow is upward relative to the plane of FIG. 3.

The left column of FIG. 3 shows a heat sink 300 made from extruded aluminum. The heat sink 300 was formed as a single integral piece of extruded aluminum, including all of the fins. As shown in the upper quadrant of the left column, the heat sink 300 is placed over a heat-generating electronic component 302. The heat sink 300 includes a single set of fins that extend the entire length and width of the heat sink 300. The fins of the heat sink 300 have a uniform arrangement with no subsets of fins with a different arrangement.

The middle column of FIG. 3 shows a heat sink 310 made from die-cast metal. The heat sink 310 was formed as a single integral piece of die-cast metal, including all of the fins. As shown in the upper quadrant of the middle column, the heat sink 310 is placed over a heat-generating electronic component 312. The heat sink 310 includes a first set of fins positioned over the heat-generating electronic component 312, and to the left and right of the heat-generating electronic component 312 that all have a generally uniform arrangement and fin pitch. The heat sink 310 also includes a second set of fins positioned in front of the heat-generating electronic component 312, relative to the direction of the airflow. The second set of fins is more sparsely arranged than the first set of fins, and has a larger fin pitch.

The right column of FIG. 3 shows a heat sink 320 formed according to the present disclosure. The heat sink 320 is generally the same as or similar to the heat sink 100, and includes a center portion that includes stacked fins, and two die-cast side portions. The heat sink 320 also includes the generally trapezoidal arrangement of more sparse fins that is formed from the fins of the center portion and the two side portions.

As shown in the bottom row of FIG. 3, the heat sink 320 (which is the same as or similar to the heat sink 100 of the present disclosure) offers better heat removal performance than both the heat sink 300 and the heat sink 310. As shown in the lower quadrant of the left column, the heat sink 300 results in a high uniform heat level generally everywhere around the heat-generating electronic component 302, and a temperature of about 88.6° C. at the heat-generating electronic component 302. The lower quadrant of the middle column shows that the heat sink 310 decreased the heat levels around the heat-generating electronic component 312, and resulted in a temperature of about 80.0° C. at the heat-generating electronic component 312. However, the lower quadrant of the right column shows that the heat sink 320 performed better than the heat sinks 300 and 310. The heat levels were reduced ever further around the heat-generating electronic component 322, with a temperature of about 76.8° C. at the heat-generating electronic component 312. Thus, the heat sink formed according to the present disclosure was able to more effectively remove heat from a heat-generating electronic component.

The rate of heat transfer out of the heat-generating electronic component and the heat sink of the present disclosure can be given by the equation $Q=hA(T(t)-T_{env})$, where h is the heat transfer coefficient of convection, A is the heat transfer surface area, $T_{env}$ is the temperature of the environment surrounding the heat sink and the heat-generating electronic component, and T(t) is the time-dependent temperature of the heat sink and the heat-generating electronic component. Generally, the rate of heat transfer Q will be fixed (e.g., will have a required value of range of values), and the time-dependent temperature T(t) will be required by the specification of the heat-generating electronic-component. The heat transfer coefficient h can be modified by modifying the airflow, and the heat transfer surface area A can be modified by modifying the area of the fins. Thus, the combinations of different fin materials and fin patterns can be used to achieve the required time-dependent temperature T(t) and/or rate of heat transfer Q.

Although the disclosed embodiments have been illustrated and described with respect to one or more implementations, equivalent alterations and modifications will occur or be known to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

While various embodiments of the present disclosure have been described above, it should be understood that they have been presented by way of example only, and not limitation. Numerous changes to the disclosed embodiments can be made in accordance with the disclosure herein, without departing from the spirit or scope of the disclosure. Thus, the breadth and scope of the present disclosure should not be limited by any of the above described embodiments. Rather, the scope of the disclosure should be defined in accordance with the following claims and their equivalents.

What is claimed is:

1. A heat sink for cooling a computing device, the heat sink comprising:
a first portion configured to directly contact a heat-generating electronic component of the computing device, the first portion including a first base and a first plurality of fins extending from the first base, the first plurality of fins including a first subset of fins and a second subset of fins, the first base having a first thermal conductivity, the first subset of the first plurality of fins having the first thermal conductivity, the second subset of the first plurality of fins having a second thermal conductivity that is different than the first thermal conductivity; and
a second portion including a second base and a second plurality of fins extending from the second base, the second base being coupled to the first base, the second plurality of fins including a first subset of fins and a second subset of fins, the second base, the first subset of the second plurality of fins, and the second subset of the second plurality of fins each having the second thermal conductivity,
wherein a fin pitch of the first subset of the first plurality of fins is less than a fin pitch of the second subset of the first plurality of fins, and wherein a fin pitch of the first subset of the second plurality of fins is (i) less than a fin pitch of the second subset of the second plurality of fins, and (ii) greater than the fin pitch of the first subset of the first plurality of fins.

2. The heat sink of claim 1, wherein the first portion is formed from a first group of one or more materials that includes extruded aluminum, stamped aluminum, or both.

3. The heat sink of claim 2, wherein the extruded aluminum, the stamped aluminum, or both, has a thermal conductivity of between about 200 W/m*K and about 250 W/m*k.

4. The heat sink of claim 1, wherein the second portion is formed from a second group of one or more materials includes a die-cast metal.

5. The heat sink of claim 4, wherein the die-cast metal is die-cast aluminum or a die-cast aluminum alloy.

6. The heat sink of claim 4, wherein the die-cast metal has a thermal conductivity of between about 50 W/m*K and about 100 W/m*K.

7. The heat sink of claim 1, wherein a combined surface area of the first plurality of fins is larger than the combined surface area of the second plurality of fins.

8. The heat sink of claim 1, wherein the first subset of the first plurality of fins is formed as a stack of fins that is coupled to the first base, the fins of the portion of the first plurality of fins being formed individually and stacked together to form the stack of fins.

9. The heat sink of claim 8, wherein the first base is formed from extruded aluminum, and wherein each fin of the first subset of the first plurality of fins is formed from stamped aluminum.

10. The heat sink of claim 1, wherein each fin of the first subset of the first plurality of fins is formed from stamped aluminum, and wherein each fin of the second subset of the first plurality of fins is formed from a die-casting process.

11. The heat sink of claim 1, further comprising a third portion including a third base and a third plurality of fins extending from the third base, the third base being coupled to the first base, the third plurality of fins including a first subset of fins and a second subset of fins, the third base, the first subset of the third plurality of fins, and the second subset of the third plurality of fins each having the second thermal conductivity.

12. The heat sink of claim 11, wherein a fin pitch of the first subset of the third plurality of fins is equal to the fin pitch of the first subset of the second plurality of fins, and wherein a fin pitch of the second subset of the third plurality of fins is equal to the fin pitch of the second subset of the second plurality of fins.

13. The heat sink of claim 12, wherein the second subset of the first plurality of fins, the second subset of the second plurality of fins, and the second subset of the third plurality of fins form a trapezoid shape positioned in front of the first subset of the first plurality of fins relative to a direction of air flowing through the heat sink.

14. A computing device comprising:
a motherboard;
a heat-generating electronic component disposed on the motherboard; and
a heat sink contacting the heat-generating electronic component, the heat sink including:
  a first portion configured to directly contact a heat-generating electronic component of the computing device, the first portion including a first base and a first plurality of fins extending from the first base, the first plurality of fins including a first subset of fins and a second subset of fins, the first base having a first thermal conductivity, the first subset of the first plurality of fins having the first thermal conductivity, the second subset of the first plurality of fins having a second thermal conductivity that is different than the first thermal conductivity; and
  a second portion including a second base and a second plurality of fins extending from the second base, the second base being coupled to the first base, the second plurality of fins including a first subset of fins and a second subset of fins, the second base, the first subset of the second plurality of fins, and the second subset of the second plurality of fins each having the second thermal conductivity,
  wherein a fin pitch of the first subset of the first plurality of fins is less than a fin pitch of the second subset of the first plurality of fins, and
  wherein a fin pitch of the first subset of the second plurality of fins is (i) less than a fin pitch of the second subset of the second plurality of fins, and (ii) greater than the fin pitch of the first subset of the first plurality of fins.

15. The computing device of claim 14, wherein the first subset of the first plurality of fins is formed from stamped aluminum, and wherein the second subset of the first plurality of fins is formed from a die-cast metal.

16. The computing device of claim 15, wherein air is configured to flow past the heat sink in a first direction, and wherein the first subset of the first plurality of fins is positioned behind the second subset of the first plurality of fins relative to the first direction, such that the air flowing past the heat sink reaches the second subset of the first plurality of fins before the first subset of the first plurality of fins.

17. The computing device of claim 14, further comprising a computing device base that is separate from the heat sink, the computing device base being coupled to the heat sink such that the motherboard and the heat-generating electronic component are positioned between (i) the computing device base and (ii) the first base and the second base of the heat sink, and such that the heat sink forms a top cover of the computing device.

* * * * *